(12) United States Patent
Kim

(10) Patent No.: US 8,358,178 B2
(45) Date of Patent: Jan. 22, 2013

(54) PHASE MODULATION APPARATUS AND METHOD

(75) Inventor: Myung-Soon Kim, Daejeon-si (KR)

(73) Assignee: Electronics and Telecommunications Research Institute, Daejeon-Si (KR)

( * ) Notice: Subject to any disclaimer, the term of this patent is extended or adjusted under 35 U.S.C. 154(b) by 252 days.

(21) Appl. No.: 12/833,281

(22) Filed: Jul. 9, 2010

(65) Prior Publication Data

US 2011/0151807 A1    Jun. 23, 2011

(30) Foreign Application Priority Data

Dec. 17, 2009  (KR) .................. 10-2009-0126242
Apr. 19, 2010  (KR) .................. 10-2010-0036024

(51) Int. Cl.
*H03C 3/00* (2006.01)
*H04B 1/00* (2006.01)

(52) U.S. Cl. .................. 332/144; 455/42; 455/61

(58) Field of Classification Search ............ 455/42, 455/61, 67.11, 180.3; 332/144, 128
See application file for complete search history.

(56) References Cited

U.S. PATENT DOCUMENTS

| | | | | |
|---|---|---|---|---|
| 5,983,077 A | * | 11/1999 | Dent | ............... 455/44 |
| 6,515,553 B1 | * | 2/2003 | Filiol et al. | ............... 332/127 |
| 7,154,347 B2 | * | 12/2006 | Grewing et al. | ............... 331/23 |
| 7,443,261 B2 | | 10/2008 | Yoshikawa et al. | |
| 7,460,499 B2 | * | 12/2008 | Eliezer et al. | ............... 370/286 |
| 2007/0205831 A1 | | 9/2007 | Yoshikawa et al. | |
| 2008/0310573 A1 | | 12/2008 | Lewis et al. | |

* cited by examiner

*Primary Examiner* — Sonny Trinh
(74) *Attorney, Agent, or Firm* — Kile Park Goekjian Reed & McManus PLLC

(57) ABSTRACT

A phase modulation apparatus and method are provided. The phase modulation apparatus includes a storage to store phase modulation setting values corresponding to various communication modes; a phase modulation setting value selector to select, when a communication mode is changed, phase modulation setting values corresponding to the changed communication mode among the phase modulation setting values stored in the storage; and a phase modulator to modulate a phase of a transmission signal using the phase modulation setting values selected by the phase modulation setting value selector. According to the phase modulation apparatus, since a frequency characteristic of a loop filter in a PLL circuit is changed depending on a transmission mode of a communication apparatus and phase modulation is performed using appropriate bandwidths according to various transmission modes, it is possible to prevent noise characteristics from degrading when a PLL bandwidth changes.

17 Claims, 5 Drawing Sheets

FIG. 2

| LOOP FILTER BANDWIDTH | $V_{t1}$ RESISTANCE(R) | $V_{t2}$ CAPACITANCE(C) |
|---|---|---|
| PLL BAND(1) | | |
| ⋮ | | ⋮ |
| PLL BAND(N) | | |

PHASE MODULATION APPARATUS AND METHOD

CROSS-REFERENCE TO RELATED APPLICATION

This application claims the benefit under 35 U.S.C. § 119(a) of a Korean Patent Applications Nos. 10-2009-0126242, filed on Dec. 17, 2009, and 10-2010-0036024, filed on Apr. 19, 2010, the entire disclosures of which are incorporated herein by reference for all purposes.

BACKGROUND

1. Field

The following description relates to a phase modulation technique, and more particularly, to a phase modulation apparatus and method which reflects a communication mode to apply a variable specification.

2. Description of the Related Art

A variable bandwidth Phase Locked Loop (PLL) is applied to a phase modulation apparatus which is generally used in a communication apparatus. Phase modulation using a variable bandwidth PLL has advantages of low cost, low power consumption, excellent noise characteristics, high modulation precision, etc.

In order to achieve high modulation precision, a PLL has to have a wider frequency bandwidth than that of a modulation signal. This is because a high reference frequency reduces a division ratio N to widen the bandwidth of a loop filter and also shorten a PLL lock time. However, a wide bandwidth of PLL degrades noise characteristics.

In order to solve the problem, a 2-point modulation method has been proposed which sets a modulation bandwidth of a PLL to be narrower than a modulation bandwidth and performs modulation within a PLL band and modulation outside of a variable PLL band at two different points.

According to the 2-point modulation method, since no control signal is transferred to a loop filter when a communication mode is a narrow-band mode, effectively only a 1-point modulation is performed. When the communication mode is a wide-band mode, control signals are transferred to individual communication apparatuses to modulate signals outside of the PLL band.

With development of cognitive access techniques and software defined radios (SDR) terminals, demands for a communication apparatus capable of supporting multiple modes are increasing, however, existing phase modulation techniques have limitations in satisfying these demands.

SUMMARY

The following description relates to a phase modulation apparatus and method that can perform phase modulation adaptively depending on a communication mode.

In one general aspect, there is provided a phase modulation apparatus including: a storage to store phase modulation setting values corresponding to various communication modes; a phase modulation setting value selector to select, when a communication mode is changed, phase modulation setting values corresponding to the changed communication mode among the phase modulation setting values stored in the storage; and a phase modulator to modulate a phase of a transmission signal using the phase modulation setting values selected by the phase modulation setting value selector. The phase modulation setting values include at least one of a reference frequency, a division ratio and a modulation bandwidth value.

In one general aspect, there is provided a phase modulation method including: deciding, when a communication mode is changed, phase modulation setting values using pre-stored information; and performing phase modulation according to the decided phase modulation setting values. The phase modulation setting values include at least one of a reference frequency, a division ratio and a modulation bandwidth value.

Accordingly, the frequency characteristics of a loop filter in a Phase Locked Loop (PLL) change depending on a transmission mode of a communication apparatus and an appropriate bandwidth is used according to a transmission modes to perform phase modulation, thereby preventing noise characteristics from degrading when the bandwidth of the PLL changes.

Also, since a reference frequency of a PLL can be changed and a division ratio can be automatically changed, a phase modulation apparatus and a data transmission apparatus is to which various communication specifications can be applied are implemented.

Furthermore, since the frequency response, reference frequency and division ratio of the loop filter in the PLL can be set to appropriate values automatically according to a transmission mode, load to other circuits can be reduced. In addition, since an appropriate PLL band of a phase modulation bandwidth can be selected according to a communication mode, noise out of the PLL band is reduced and noise characteristics are improved, which leads to performance improvement of a communication apparatus.

Other features and aspects will be apparent from the following detailed description, the drawings, and the claims.

BRIEF DESCRIPTION OF THE DRAWINGS

FIG. 2 is an example of a reference table that is used to decide a voltage signal for controlling a loop filter in the phase modulation apparatus illustrated in FIG. 1.

Figure 1:
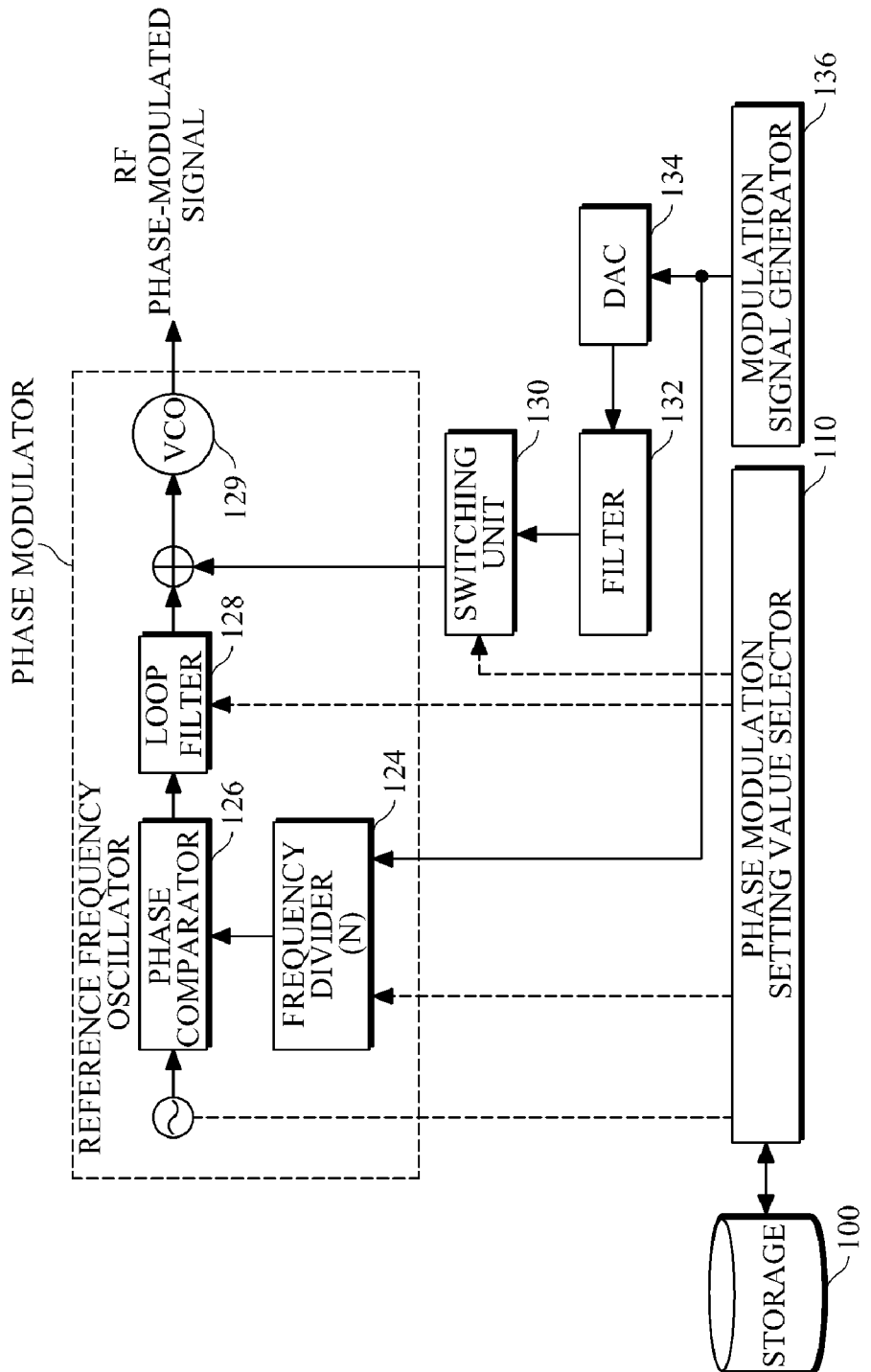
FIG. 1 is a diagram illustrating an example of a phase modulation apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a diagram illustrating an example of a phase modulation apparatus.

Referring to FIG. 1, the phase modulation apparatus includes: a phase modulator 120, a storage 100, a phase modulation setting value selector 110, a switching unit 130, a filter 132, a digital-to-analog converter 134 and a modulation signal generator 136. The phase modulator 120 includes a reference frequency oscillator 122, a phase comparator 126, a loop filter 128, a voltage-controlled oscillator 129 and a frequency divider 124.

The phase modulation apparatus has to determine an appropriate reference frequency, an appropriate division ratio (N) and an appropriate loop bandwidth when a communication mode changes.

Conventionally, in the case of a single or multi mode, a reference frequency and a division ratio are both fixed or only a division ratio is changeable. However, a communication apparatus capable of supporting various communication modes, which is to be developed in the future, has to be able to change both a reference frequency and a division ratio. Optimal values of the reference frequency and division ratio may be predetermined.

The storage 100 may be a memory, and stores an optimized reference frequency, division ratio and loop bandwidth with respect to various communication modes, in the form of a table.

According to an example, the phase modulation setting value selector 110 decides a is modulation bandwidth according to a communication mode based on stored information, and outputs a voltage signal for controlling the loop filter 128 to change a PLL bandwidth. For example, the phase modulation setting value selector 110 decides a reference frequency, a division ratio and a modulation bandwidth, with reference to the table that is stored in the storage 100 and includes information about reference frequencies, division ratios (N) and modulation bandwidths with respect to communication modes. Then, the phase modulation setting value selector 10 transfers the decided reference frequency, division ratio and modulation width to the reference frequency oscillator 122, the frequency divider 124, the switching unit 130 and the loop filter 128. Accordingly, depending on a communication mode, the switching unit 130 is turned on or off to perform 1-point modulation or 2-point modulation, so that a reference frequency, a division ratio and a bandwidth of a PLL circuit are changed. Also, the frequency response of the loop filter 128 is changed.

The phase modulation setting value selector 110 outputs, when the modulation bandwidth is set to a narrow-band mode with reference to the table that includes modulation bandwidths with respect to communication modes, a control signal for turning off the switching unit 130. If the switching unit 130 is turned off, 1-point modulation is performed so as not to perform the modulation out of the PLL band. Then, the phase modulation setting value selector 110 outputs voltage signals $V_{t1}$ and $V_{t2}$ to be input to the loop filter 128, the voltage signals $V_{t1}$ and $V_{t2}$ decided according to the decided modulation bandwidth. In the phase modulation apparatus, since the frequency of the loop filter 128 is lowered when the communication mode is a narrow-band mode, a resonance point of the frequency of the loop filter 128 with resistance is lowered to make a bandwidth narrow.

Meanwhile, the phase modulation setting value selector 110 transfers a control signal to the switching unit 130 with reference to the table that includes modulation bandwidths with respect to communication modes, thus turning on the switching unit 130. If the switching unit 130 is turned on, 2-point modulation is performed to perform the modulation out of the PLL band.

Also, the phase modulation setting value selector 110 outputs voltage signals $V_{t1}$ and $V_{t2}$ to be input to the loop filter 128, the voltage signals $V_{t1}$ and $V_{t2}$ decided according to the decided modulation bandwidth. When the communication mode is a wide-band mode, the frequency of the loop filter 120 is raised and a resonance point of the frequency of the loop filter 128 with resistance is accordingly raised, resulting in an increase of a bandwidth.

FIG. 2 is an example of a reference table that is used to decide a voltage signal for controlling the loop filter 128 in the phase modulation apparatus illustrated in FIG. 1.

Referring to FIGS. 1 and 2, the phase modulation setting value selector 110 may decide a voltage signal for controlling the loop filter 128 appropriately according to a communication mode, with reference to predetermined table information seen in FIG. 2. According to an example, the reference table, which is constructed according to a general PLL design procedure, is made in various forms depending on applications.

Figure 3:
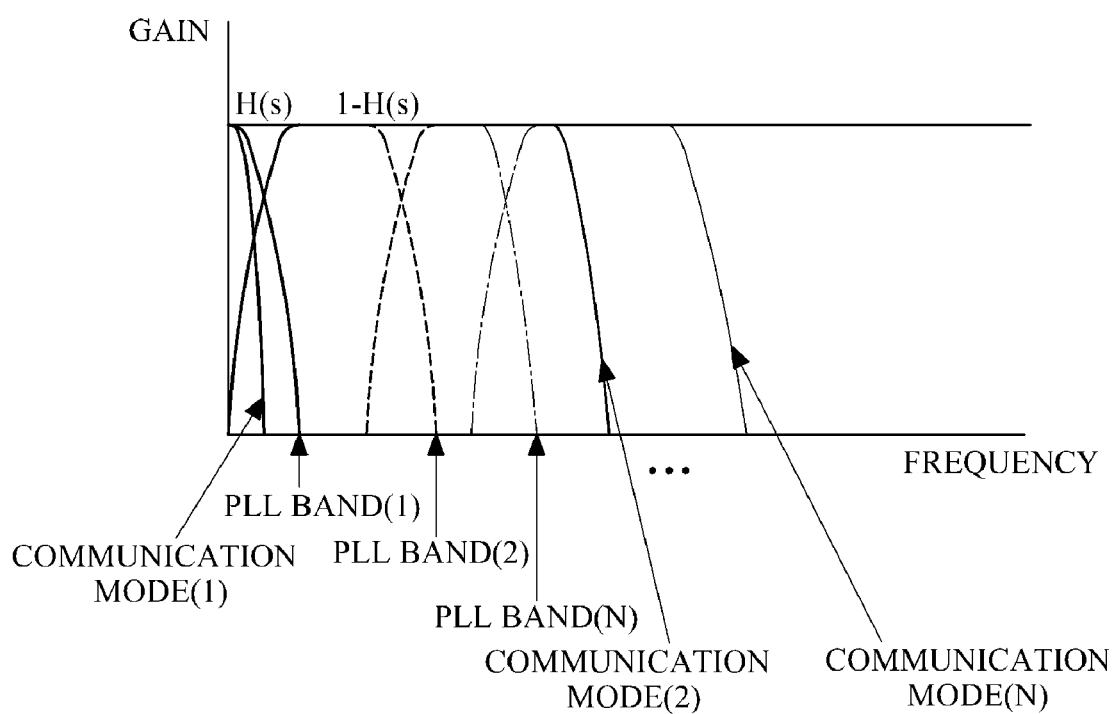
FIG. 3 is a characteristic graph showing the relationship between a modulation bandwidth and a PLL bandwidth.

FIG. 3 is a characteristic graph showing the relationship between a modulation bandwidth and a PLL bandwidth.

As seen in FIG. 3, if a PLL band 1 denoted in a solid line is narrowed, its bandwidth H(s) is also narrowed. However, the bandwidth H(s) of the PLL band 1 is still wider than a transmission bandwidth of a communication mode 1 which is a narrow-band mode. By preventing an output signal from being positioned outside a modulation band of a modulation signal, it is possible to reduce degradation of modulation precision and suppress power consumption.

Meanwhile, referring to FIGS. 1 and 3, when the communication mode 1 is a wide-band mode, the frequency of the loop filter 128 is raised due to input voltage signals $V_{t1}$ and $V_{t2}$ of the loop filter 128 which are decided by the phase modulation setting value selector 110, and a resonance point of the frequency of the loop filter 128 with resistance is also raised, which increases a bandwidth.

As seen in FIG. 3, the bandwidth of a PLL circuit is widened from the PLL band 1 to a PLL band 2.

In a wide-band modulation mode, when the switching unit 130 is controlled to be turned on, 2-point modulation is performed, a resonance point of the loop filter 128 is changed and a PLL bandwidth H(s) is wider than in a narrow-band mode. Also, if a communication mode bandwidth is further widened when 2-point modulation is performed, the resonance point of the frequency of the loop filter 128 with resistance is further raised due to the input voltage signals $V_{t1}$ and $V_{t2}$ of the loop filter 128, which are decided according to a modulation bandwidth.

Accordingly, as seen in FIG. 3, the bandwidth of the PLL circuit is widened from the PLL band 2 to a PLL band N.

In other words, in the wide-band modulation mode, by varying the resistance value of the loop filter 128, it is possible to reduce the outer region of the PLL band. Accordingly, characteristic degradation due to sensitivity and linearity of a voltage-controlled oscillator (VCO) may be reduced. In addition, the VCO may be allocated a noise margin, which relieves a design specification.

Figure 4:
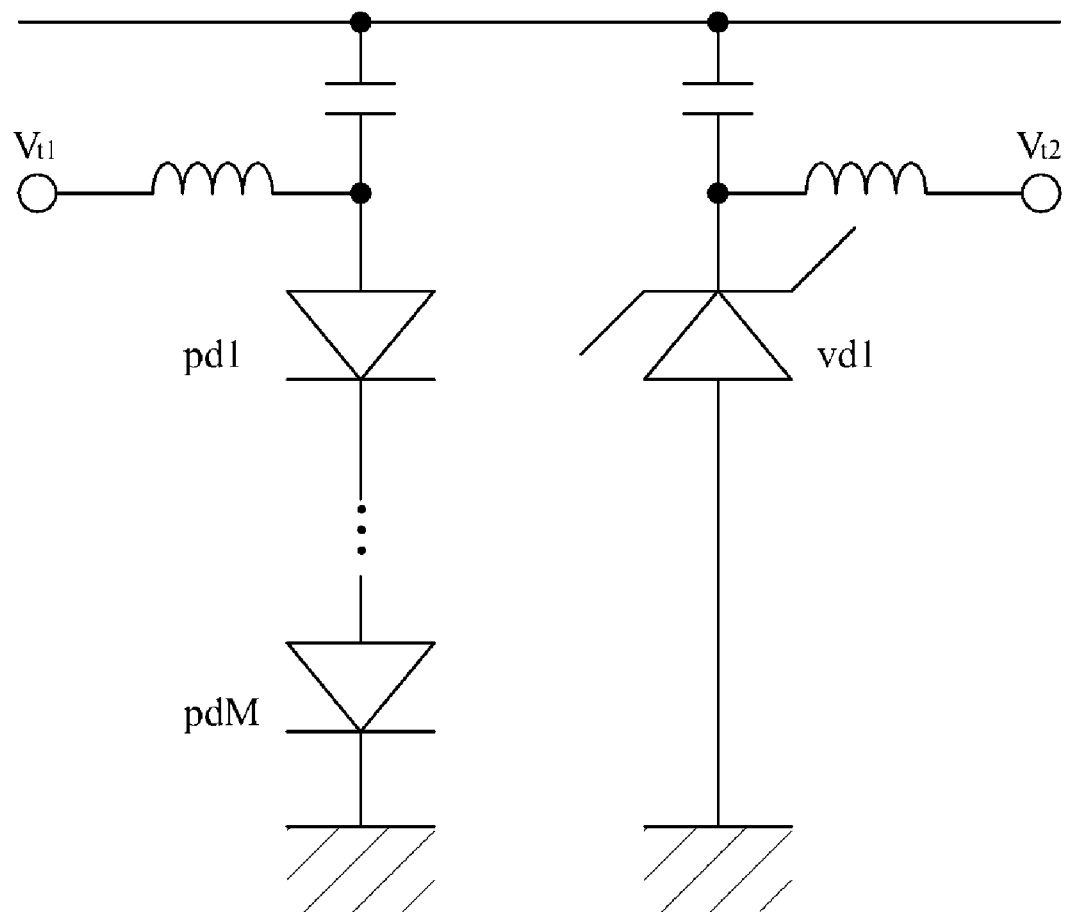
FIG. 4 is a circuit diagram illustrating an example of a loop filter.

FIG. 4 is a circuit diagram illustrating an example of a loop filter. As illustrated in FIG. 4, the loop filter may be implemented with various configurations that use variable resistors and variable capacitors to change a PLL bandwidth in order to support various communication modes. A plurality of pin diodes pd1, . . . , pdM is are arranged to implement variable resistance to thus widen a variable range of resistance. Also, a varactor diode vd1 may be provided to form a variable capacitor. However, the configuration of the loop filter is not limited to this.

Figure 5:
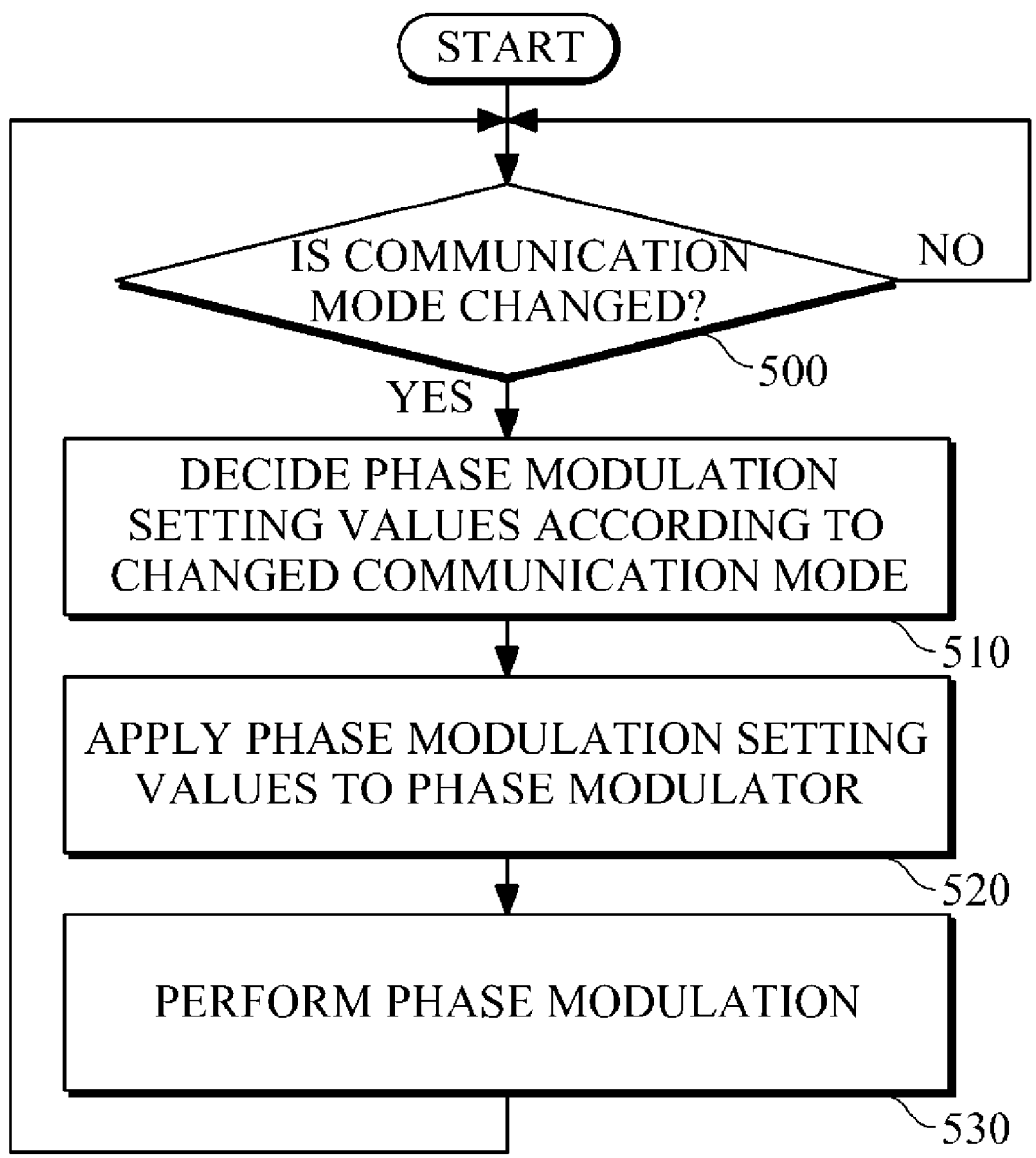
FIG. 5 is a flowchart illustrating an example of a phase modulation method.

FIG. 5 is a flowchart illustrating an example of a phase modulation method.

A phase modulation apparatus decides, when determining that a communication mode has been changed (operation 500), phase modulation setting values according to the changed communication mode (operation 510). At this time, the phase modulation apparatus has to decide an appropriate reference frequency, division ratio (N) and loop bandwidth according to the changed communication mode. The phase modulation setting values are decided with reference to a pre-stored table. Then, the phase modulation setting values are applied to a phase modulator (operation 520).

In detail, application of the phase modulation setting values is to provide reference frequency information to a reference frequency oscillator, a division ratio value to a s frequency divider, filter bandwidth information to a loop filter and an on/off control signal to a switching unit.

According to an example, when a modulation bandwidth is set to a narrow-band mode with reference to a table that includes modulation bandwidths with respect to communication modes, a control signal for turning off the switching unit is output. If the switching unit 130 is tuned off, 1-point modulation is performed so as not to perform the modulation out of a PLL band.

Then, voltage signals $V_{r1}$ and $V_{r2}$ to be input to the loop filter are output according to the set modulation bandwidth. In the phase modulation apparatus, since the frequency of the loop filter 128 is lowered when the communication mode is a narrow-band mode, a is resonance point of the frequency of the loop filter with resistance is lowered to make a bandwidth narrow.

A phase modulator may perform phase modulation based on the phase modulation setting values (operation 530).

The processes, functions, methods and/or software described above may be recorded, stored, or fixed in one or more computer-readable storage media that includes program instructions to be implemented by a computer to cause a processor to execute or perform the program instructions. The storage includes magnetic media, optical media and the like.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A phase modulation apparatus comprising:
a storage to store phase modulation setting values corresponding to various communication modes;
a phase modulation setting value selector to select, when a communication mode is changed, phase modulation setting values corresponding to the changed communication mode among the phase modulation setting values stored in the storage, wherein the selected phase modulation setting values comprise a selected reference frequency value; and
a phase modulator to modulate a phase of a transmission signal using the phase modulation setting values selected by the phase modulation setting value selector, wherein the phase modulator comprises a reference frequency oscillator, and wherein the reference frequency oscillator receives the selected reference frequency value from the phase modulation setting value selector and oscillates a reference frequency signal according to the selected reference frequency value.

2. The phase modulation apparatus of claim 1, wherein the selected phase modulation setting values further comprise a selected division ratio value and a selected modulation bandwidth value.

3. The phase modulation apparatus of claim 1, wherein the selected phase modulation setting values further comprise a selected division ratio value, wherein the phase modulator comprises a frequency divider, and wherein the frequency divider receives the selected division ratio value from the phase modulation setting value selector and performs frequency division according to the selected division ratio value.

4. The phase modulation apparatus of claim 1, wherein the selected phase modulation setting values further comprise a selected modulation bandwidth value, wherein the phase modulator comprises a loop filter, and wherein the loop filter receives the selected modulation bandwidth value from the phase modulation setting value selector and outputs a different frequency response according to the selected modulation bandwidth value.

5. The phase modulation apparatus of claim 4, wherein the loop filter comprises a variable resistor and a variable capacitor.

6. The phase modulation apparatus of claim 5, wherein the variable resistor includes a plurality of pin diodes.

7. The phase modulation apparatus of claim 5, wherein the variable capacitor is a varactor-diode.

8. The phase modulation apparatus of claim 1, further comprising a switching unit to switch a modulation method to 1-point modulation or 2-point modulation according to an on/off state.

9. The phase modulation apparatus of claim 1,
wherein the selected phase modulation setting values further comprise a selected division ratio value and a selected modulation bandwidth value,
wherein the phase modulator further comprises a frequency divider and a loop filter, and
wherein the phase modulation setting value selector, after selecting the phase modulation setting values corresponding to the changed communication mode, sends the selected reference frequency value to the reference frequency oscillator, sends the selected division ratio value to the frequency divider, and sends the selected modulation bandwidth value to the loop filter.

10. The phase modulation apparatus of claim 1,
wherein the storage stores N sets of phase modulation setting values that correspond to N respective communication modes,
wherein each set of phase modulation setting values comprises a reference frequency value, a division ratio value, and a modulation bandwidth value,
wherein N is greater than or equal to two, and
wherein the phase modulation setting value selector selects the phase modulation setting values by selecting a set from the N sets stored in the storage.

11. A phase modulation method comprising:
selecting, when a communication mode is changed, phase modulation setting values using pre-stored information, wherein the selected phase modulation setting values comprise a selected reference frequency value; and
performing phase modulation according to the selected phase modulation setting values, wherein the performing the phase modulation comprises receiving the selected reference frequency value at a reference frequency oscillator, and oscillating a reference frequency signal at the reference frequency oscillator according to the selected reference frequency value.

12. The phase modulation method of claim 11, wherein the selected phase modulation setting values further comprise a selected division ratio value and a selected modulation bandwidth value.

13. The phase modulation method of claim 11, wherein the selected phase modulation setting values further comprise a selected division ratio value, and wherein the performing the phase modulation comprises receiving the selected division ratio value at a frequency divider and performing frequency division at the frequency divider according to the selected division ratio value.

14. The phase modulation method of claim 11, wherein the selected phase modulation setting values further comprise a selected modulation bandwidth value, and wherein the performing the phase modulation comprises receiving the selected modulation bandwidth value at a loop filter and outputting a different frequency response at the loop filter according to the selected modulation bandwidth value.

15. The phase modulation method of claim 11, wherein the performing the phase modulation comprises switching a modulation method to 1-point modulation or 2-point modulation.

16. The phase modulation method of claim 11,
wherein the selected phase modulation setting values further comprise a selected division ratio value and a selected modulation bandwidth value, and
after the selecting the phase modulation setting values, sending the selected reference frequency value to the reference frequency oscillator, sending the selected division ratio value to a frequency divider, and sending the selected modulation bandwidth value to a loop filter.

17. The phase modulation method of claim 11,
wherein the pre-stored information comprises N sets of phase modulation setting values that correspond to N respective communication modes,
wherein each set of phase modulation setting values comprises a reference frequency value, a division ratio value, and a modulation bandwidth value,
wherein N is greater than or equal to two, and
wherein the selecting the phase modulation setting values comprises selecting a set from the N sets in the pre-stored information.

* * * * *